(12) United States Patent
Li et al.

(10) Patent No.: US 7,441,174 B2
(45) Date of Patent: Oct. 21, 2008

(54) EMBEDDED STATE METRIC STORAGE FOR MAP DECODER OF TURBO CODES

(75) Inventors: Victor On-Kwok Li, Hong Kong (CN); Jianhao Hu, Sichuan (CN); Alfred K. K. Wong, Brookline, MA (US)

(73) Assignee: The University of Hong Kong, Hong Kong (CN)

( * ) Notice: Subject to any disclaimer, the term of this patent is extended or adjusted under 35 U.S.C. 154(b) by 629 days.

(21) Appl. No.: 11/221,311

(22) Filed: Sep. 7, 2005

(65) Prior Publication Data

US 2007/0055919 A1  Mar. 8, 2007

(51) Int. Cl.
*H03M 13/00* (2006.01)

(52) U.S. Cl. .................. 714/755; 714/786; 714/794; 714/795; 375/341; 375/262; 375/265

(58) Field of Classification Search ................ 714/755, 714/792, 794–796; 375/242, 262, 265, 341
See application file for complete search history.

(56) References Cited

U.S. PATENT DOCUMENTS

| | | | |
|---|---|---|---|
| 6,189,126 B1 | 2/2001 | Ulmer et al. | |
| 6,400,290 B1 | 6/2002 | Langhammer et al. | |
| 6,516,444 B1 | 2/2003 | Maru | |
| 6,563,877 B1 * | 5/2003 | Abbaszadeh | 375/242 |
| 6,598,204 B1 | 7/2003 | Giese et al. | |
| 6,813,743 B1 * | 11/2004 | Eidson | 714/795 |
| 6,910,171 B2 * | 6/2005 | Dielissen | 714/755 |
| 6,993,704 B2 * | 1/2006 | Wolf | 714/794 |
| 2003/0123579 A1 * | 7/2003 | Safavi et al. | 375/341 |

OTHER PUBLICATIONS

Berrou, C. et al., "Near Shannon Limit Error—Correcting Coding and Decoding: Turbo-Codes," IEEE, 1993, 1064-1070.

(Continued)

*Primary Examiner*—Guy J Lamarre
(74) *Attorney, Agent, or Firm*—Robert D. Katz; Cooper & Dunham LLP

(57) ABSTRACT

A method, an embedded state metric storage, is used for MAP (Maximum A Posterior)-based decoder of turbo codes to reduce the memory requirement of state metric storage. For MAP decoder, this method comprises selecting any state metric from the updated state metrics for each recursion direction, forward and reverse, and dividing the state metrics by the selected state metric; the selected state metric value becomes a constant, namely, one. The constant one state metric is embedded into the resulted state metrics. For log-MAP decoder, this method comprises selecting any state metric from the updated state metrics in each direction, forward and reverse, and subtracting the state metrics from the selected state metric; the selected state metric value becomes a constant, zero. The constant zero state metric is embedded into the resulted state metrics. One advantage of the embedded state metric storage during state metric updating and likelihood ratio calculation is to embed the information of the selected state metric into the resulted state metrics. Thus, the selected state metric is not required to be kept in the state metric memory, and calculation of a constant state metric in the resulted state metric can be omitted. Therefore, the latency and the area of implementation in ASIC will be reduced with this method of embedded state metric storage.

12 Claims, 6 Drawing Sheets

OTHER PUBLICATIONS

Bahl, L. et al., "Optimal Decoding of Linear Codes for Minimizing Symbol Error Rate," IEEE Transactions on Information Theory, 1974, 284-287, vol. IT-19.

Robertson, P. et al., "A Comparison of Optimal and Sub-Optimal MAP Decoding Algorithms Operating in the Log Domain," IEEE, 1998, 1009-1013.

Viterbi, A., "An Intuitive Justification and a Simplified Implementation of the MAP Decoder . . . ," IEEE Journal on Selected Areas in Communication, 1998, 260-264, vol. 16.

Berrou et al., Near Shannon Limit Error—Correcting Coding and Decoding: Turbo-Codes (1), Proc. 1993 International Conference on Communication, pp. 1064-1070 (1993).

Bahl et al., "Optimal Decoding of Linear Codes for Minimizing Symbol Error Rate", IEEE Transactions on Information Theory, pp. 284-287 (Mar. 1974).

Robertson et al., "A Comparison of Optimal and Sub-Optimal MAP Decoding Algorithms Operating in the Log Domain", Proc. 1995 International Conference on Communication, pp. 1009-1013 (1995).

Andrew J. Viterbi, "An Intuitive Justification and a Simplified Implementation of the MAP Decoder for Convolutional Codes", IEEE Journal on Selected Areas in Communications, vol. 16, No. 2, pp. 260-264 (Feb. 1998).

* cited by examiner

EMBEDDED STATE METRIC STORAGE FOR MAP DECODER OF TURBO CODES

FIELD OF THE INVENTION

The present invention relates to implementation of MAP (Maximum A Posterior)-based algorithm. More specifically, the present invention reduces the memory requirement for state metric storage in MAP-based decoders by embedding the selected state metric information into the state metrics.

BACKGROUND OF THE INVENTION

Reliable data transmission is very important for wireless communication systems. Turbo codes, originally described by Berrou et al. "Near Shannon limit error-correcting coding and decoding Turbo codes," *Proc. 1993 Int. Conf. on Comm.*, pp. 1064-1070, which is incorporated herein by reference, can achieve a channel capacity near the Shannon Limit with sufficient Signal to Noise Ratio (SNR); also see U.S. Pat. No. 6,598,204 B1, "System and Method of Turbo Decoding" to Giese et al., issued on Jul. 22, 2003, and U.S. Pat. No. 6,516,444 B1, "Turbo-Code decoder" to Maru, issued on Feb. 4, 2003, each of which is incorporated herein by reference.

Decoding of Turbo codes is performed in an iterative way: the information processed by one decoder is fed into another decoder iteratively until a certain degree of convergence is achieved. Decoding within each decoder can be performed in several ways. Maximum A Posteriori (MAP) decoding based on the BCJR algorithm, proposed by Bahl et al., "Optimal decoding of linear codes for minimizing symbol error rate," *IEEE Trans. On Inf. Theory*, pp. 284-287, March 1974, which is incorporated herein by reference, is widely used. BCJR decoding is done according to a trellis chart, by mapping the status of convolutional memory at time k to its states at time k. As a posteriori probability (APP) is used as the probability metric for the trellis, the BCJR algorithm is generally referred to as the Maximum A Posteriori method.

In practice, the a posteriori probability may be computed in terms of the log domain value, in order to reduce complexity. Such an algorithm is referred to as the log-MAP algorithm. In an effort to reduce the decoding complexity of the BCJR algorithm, the log-MAP algorithm utilizes a suboptimum realization of the BCJR algorithm, using log-likelihood ratios and some approximations to avoid calculating the actual probabilities, and simplify some computations, for example by omitting some insignificant computations in the BCJR algorithm to reduce the complexity. These approximation algorithms indeed have smaller complexity than the BCJR algorithm, though, their error performance is not as good as that of the BCJR algorithm. Furthermore, the construction of the entire trellis diagram is still necessary in these methods.

A further simplified log-MAP algorithm is referred to as the Max log-MAP algorithm. In log-MAP algorithm, a log summation of exponentiation operations, In $$\sum_j e^j,$$

is calculated during extrinsic information update. The exponentiation enhances the differences between individual values in the log summation. Hence, one term will dominate the log sum, which suggests the approximation $$\ln \sum_j e^{a_j} \approx \max_j (a_j).$$

The log-MAP algorithm with this approximation is referred to as the Max log-Map algorithm. Thus, Max log-Map is much simpler than log-MAP, but at the expense of performance degradation.

The objective of the MAP algorithm is to obtain a good guess of bit information probabilities. These probabilities include systematic information, intrinsic information and extrinsic information. The extrinsic information is used by another decoder in the next iteration. After a certain number of iterations, the result of extrinsic information converges and the iterative process stops. The performance of Turbo decoder based on the MAP algorithm is close to the Shannon limit.

Although the performance of Turbo codes is near optimal, integrated circuit implementation of the MAP algorithm faces two main challenges: latency and memory requirement. Upon receiving a data frame, the MAP decoder works in an iterative way. In each iteration, the MAP decoder accesses the data frame and the extrinsic information generated in the previous iteration from head to tail (forward recursion) and then from tail to head (backward recursion) to collect decoding information. Based on the collected information, the decoder estimates the most likely input data. The estimation of extrinsic information is fed back to another decoder in the next iteration. This means that, for each iteration, the MAP decoder must process the data from the beginning of the data frame to the end, and then process in the reverse direction before the estimation of the extrinsic information will be made. For a data frame of n bits, the process of getting the extrinsic information takes 2n steps, and the estimation needs n steps. Hence, latency of the MAP algorithm is large. The MAP decoder has to keep all of the decoding information until the extrinsic information is generated, and the extrinsic information must be stored for the next iteration. For a data frame of n samples and a turbo code space of S, 2×n×S memory units are required to store the temporary information. For example, S=8, n=20730 in the turbo codes of the cdma2000 system, 331680 memory units are required for the MAP decoder.

It is desirable to provide a method to reduce the memory requirement and speed up the calculation in the MAP decoder.

SUMMARY OF THE INVENTION

The present invention relates to implementation of MAP-based algorithm in MAP-based turbo decoders. More specifically, in an illustrated embodiment, the present invention reduces the memory requirement for state metric storage in MAP-based decoders by embedding selected state metric information into the state metrics.

In a MAP or log-MAP decoder, it is important to calculate the relative probability values among state metrics, not the absolute probability values. A state metric with the largest value means the state is the correct state on the optimal decoding path with the highest probability. A state metric having a larger value provides more significance than one having smaller value during metric updating and extrinsic information calculation.

In the illustrated method, embedded state metric storage is used for a MAP decoder of Turbo codes to reduce the memory requirement for state metric storage. For a MAP turbo decoder, this method comprises selecting any state metric from the updated state metrics for each recursion direction, forward and reverse, and dividing the state metrics by the selected state metric; the selected state metric value becomes a constant, namely, one. The constant one state metric is embedded into the resulting state metrics.

The constant one state metric is defined as the embedded state metric.

For a log-MAP decoder, including its simplification a Max log-MAP decoder, this method comprises selecting any state metric from the updated state metrics in each direction, forward and reverse, and subtracting the state metrics from the selected state metric; the selected state metric value becomes a constant, zero. The constant zero state metric is embedded into the resulted state metrics. The constant zero state metric is defined as the embedded state metric. The advantage of embedded state metric storage during state metric updating and likelihood ratio calculation is to embed the information of the selected state metric into the resulting state metrics. Thus, the embedded (or selected) state metric is not required to be kept in the state metric memory, and calculation of a constant state metric in the resulting state metric can be omitted. Therefore, the latency and memory area utilization in this implementation will be reduced.

DETAILED DESCRIPTION OF THE INVENTION

The following variables will be used in describing the present invention:

$\alpha_k$ is the state metric of the MAP decoder in the forward direction at the k-th step;

$A_k$ is a natural log value of the state metric $\alpha_k$ of the MAP decoder in the forward direction at the k-th step;

$\beta_k$ is the state metric of the MAP decoder in the reverse direction at the k-th step;

$B_k$ is the natural log value of the state metric $\beta_k$ of the MAP decoder in the reverse direction at the k-th step;

$LLe_k$ is the extrinsic information of the MAP decoder for the k-th symbol;

$LLR_k$ is the natural log value of the extrinsic information of the MAP decoder for the k-th symbol;

S is the collection of state space for the turbo codes;

m is the number of state registers in an encoder;

M ($=2^m$) is the number of discrete states in the collection state space S;

$x_k$ is the k-th symbol on the decoding path;

$y_k$ is the k-th parity code word on the decoding path;

$ds_k$ is the k-th symbol fed into the decoder;

$dp_k$ is the k-th parity code word fed into the decoder;

$s^+$ is the sub-collection of the states transferred from s' to s, (s'→s), when $x_k=+1$;

$s^-$ is the sub-collection of the states transferred from s' to s, (s'→s), when $x_k=-1$;

length is the length of the data frame for the decoder.

Figure 1:
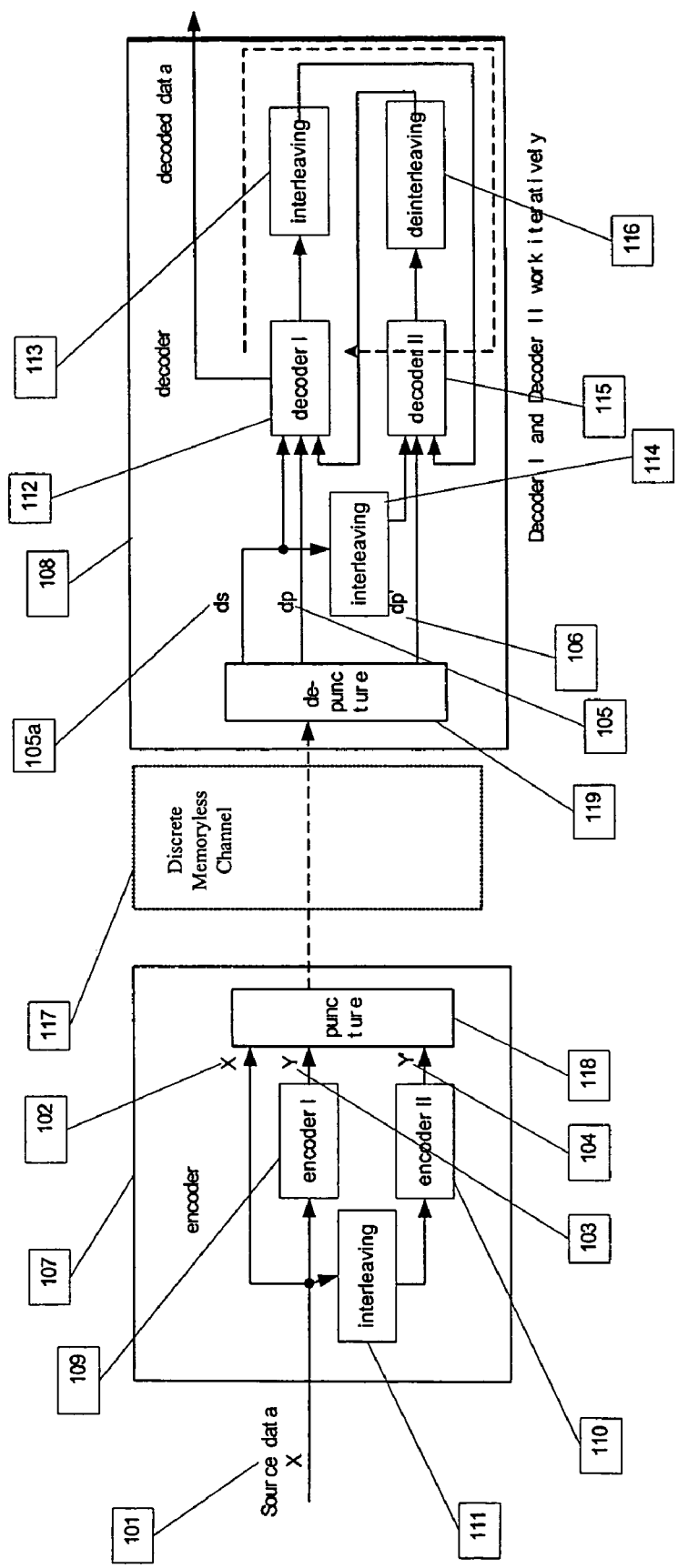
FIG. 1 is a simplified block diagram of the Turbo encoder and decoder on a digital communication system in which the present invention is used.

FIG. 1 is a simple block diagram representing a Turbo encoder and a Turbo decoder. The Turbo encoder 107 is formed by a combination of two simple encoders 109 and 110. Assuming a source data frame 101 with length information bits, the first encoder 109 receives as its input the information bits in its original from. The same length information bits are fed through an interleaver 111 that permutes the information bits before inputting them into the second encoder 110. The two encoders 109 and 110 generate parity symbols 103(y) and 104(y') from two recursive convolutional codes, respectively. The parity symbols are used in the two recursive decoders at the receiver, respectively, to produce independent, extrinsic information to help decoding algorithm convergence. These encoded information bit streams, as well as source data 102(x) are then punctured by the puncturing mechanism 118 to save bandwidth. Puncturing is a selection scheme for parity symbols 103(y) and 104(y') according to the coding rate.

The punctured information bit streams are transmitted through a noisy discrete memoryless channel 117, and received and de-punctured at a puncturing mechanism 119 at the decoder 108. In the decoder 108, a demodulator (not shown) sends soft information relating to the received bit stream, i.e., probabilities of the received values. These probabilities can be interpreted as containing the received information bit value and the associated confidence value, which indicates how likely this information bit is correct.

Firstly, the parity bit streams 105*a* (ds) and 105 (dp) of the received information bits are fed to the first decoder 112. The first decoder 112 evaluates and combines the probabilities of the input bit streams to refine the soft information so that the confidence level of individual bits being correct is maximized, since the maximum a posteriori decoding based on the BCJR algorithm is used in the decoder. The refined probabilities are fed into the second decoder 115 along with the de-interleaved information bit stream and the second parities bit stream 106(dp'), again producing enhanced soft information. After a predetermined number of iterations, the decoding process is completed, and the soft values are available at the output. According to the study in "Near Shannon limit error-correcting coding and decoding Turbo codes," *Proc.* 1993 *Int. Conf. on Comm.*, pp. 1064-1070, which is incorporated herein by reference, the improvement of bit error rate (BER) worsens with the increase in the number of iteration. To simplify the implementation, the number of iterations is preferably selected as 7 or slightly bigger, although the invention is not limited to this range.

When data is exchanged between the two decoders 112 and 115, the soft values are reordered to match the interleaving structure. This is preformed by the interleaver 113 and de-interleaver 116. An interleaver is a device that rearranges the ordering of a sequence of symbols in some one to one deterministic manner. Associated with any interleaver is a de-interleaver, which is the device that restores the reordered sequence to its original ordering. The parity symbol information from two parallel recursive convolutional encoders is used in two decoders respectively. The extrinsic information from decoder I 112 must be interleaved to produce the same sequence order with the parity information generated by encoder II 110. The interleaved extrinsic information and source symbol information are fed into decoder II 115 with the parity information generated by encoder II 110 to perform the second decoding step. The extrinsic information from decoder II 115 is fed into de-interleaver 116 to restore its original ordering, which is the same ordering with source symbol information ds 104 and parity information dp 119 generated by encoder I 109. Thus, decoder I 112 can work correctly to calculate the extrinsic information for the next iteration.

Figure 2:
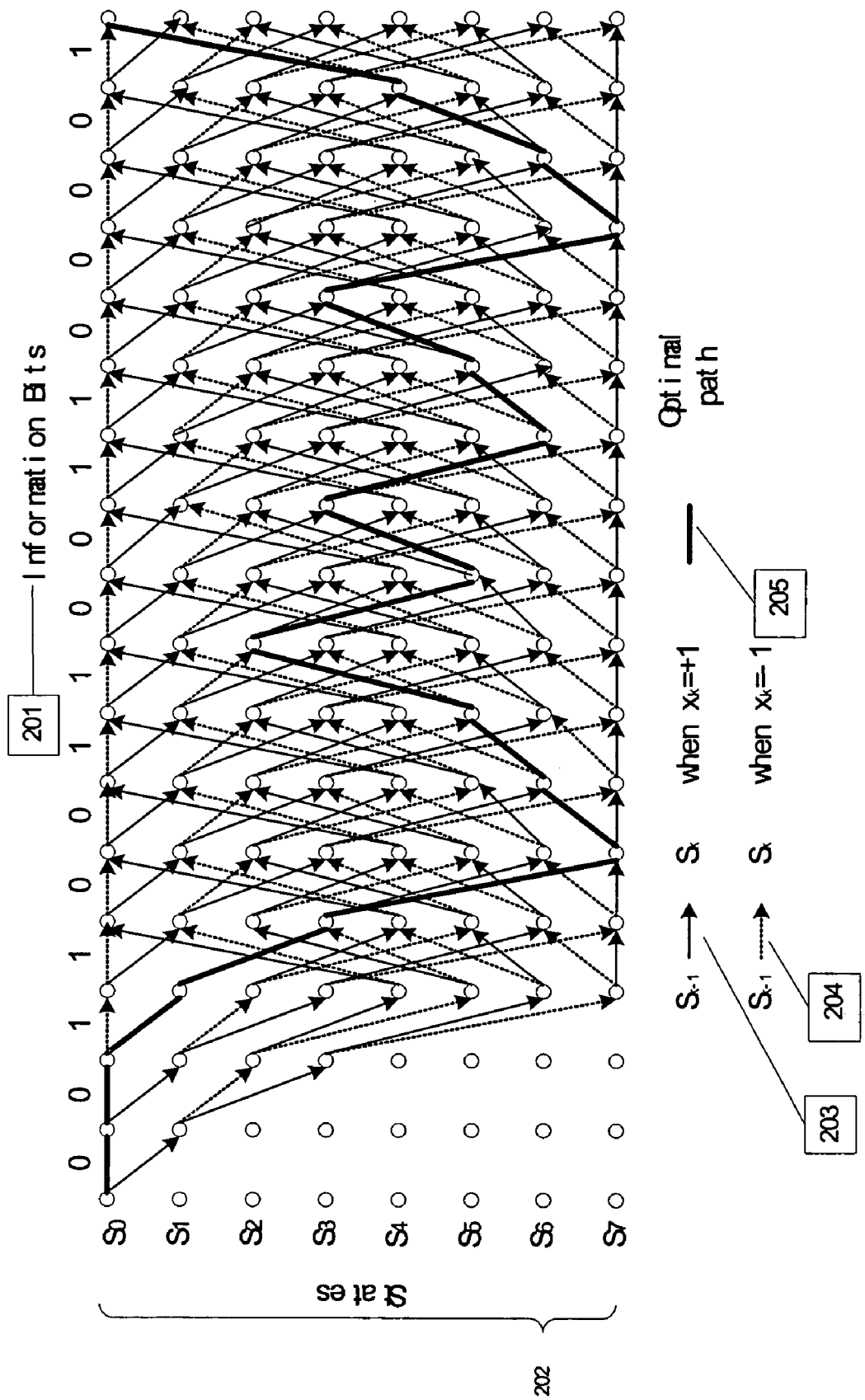
FIG. 2 is a simplified decoding path for the turbo code with a length=15 and S=8.

FIG. 2 is a simplified decoding path for the Turbo code with a length=17 and S=8. In a MAP decoder, there are 8 states 202 corresponding to each step. Each state transits to two states of the next step corresponding to the input information bit being zero 203 and one 204, respectively. The MAP decoder evaluates and combines the probabilities of the received data 201 from head to tail to obtain forward state metrics $\alpha$, and from tail to head to obtain reverse state metrics $\beta$. Then the MAP decoder uses the forward and reverse state metrics to refine the soft information, i.e., the MAP decoder finds out the optimal decoding path 205 from all possible paths. The optimal decoding path 205 is the best guess for all input data.

In the forward direction, the state metrics $\alpha_k=(\alpha_k(0), \alpha_k(1), \ldots, \alpha_k(M-1))$ are obtained with $\alpha_{k-1}=(\alpha_{k-1}(0), \alpha_{k-1}(1), \ldots, \alpha_{k-1}(M-1))$. In the reverse direction, the state metrics $\beta_k=(\beta_k(0), \beta_k(1), \ldots, \beta_k(M-1))$ are obtained with $\beta_{k+1}=(\beta_{k-1}(0), \beta_{k-1}(1), \ldots, \beta_{k-1}(M-1)$. According to the MAP algorithm, the state metrics represent the state transition probabilities from one step to the next step. If overflow occurs during state metrics updating due to the limited bit width of the state metrics in the implementation, errors are generated, and the errors will propagate inside the MAP decoder. Thus, the state metrics must be normalized by the term $\Sigma_s \Sigma_{s'} \alpha_{k-1}(s') \gamma_k(s',s) \cdot \alpha_k$ and $\beta_{k-1}$ are calculated as following $$\alpha_k(s) = \frac{\sum_{s'} \alpha_{k-1}(s') \gamma_k(s', s)}{\sum_s \sum_{s'} \alpha_{k-1}(s') \gamma_k(s', s)} \quad (1)$$

$$\beta_{k-1}(s') = \frac{\sum_s \beta_k(s) \gamma_k(s', s)}{\sum_s \sum_{s'} \alpha_{k-1}(s') \gamma_k(s', s)} \quad (2)$$

where $s \in S$, $s' \in S$

The state transition probability $\gamma_k(s',s)$, the branch metrics, is defined as $$\gamma_k(s', s) = p(s_k = s/s_{k-1} = s')$$
$$= \exp\left[\frac{1}{2} x_k (LLe_k + L_c ds_k^s) + \frac{1}{2} L_c dp_k Y_k\right]$$
$$= \exp\left[\frac{1}{2} x_k (LLe_k + L_c ds_k^s)\right] \cdot \gamma_k^e(s', s)$$

where $$\gamma_k^e(s', s) = \exp\left[\frac{1}{2} L_c dp_k Y_k\right].$$

The extrinsic information, soft information, is $$LLe_k = \frac{\sum_{s^+} \alpha_{k-1}(s') \gamma^e(s', s) \beta_k(s)}{\sum_{s^-} \alpha_{k-1}(s') \gamma^e(s', s) \beta_k(s)}. \quad (3)$$

Figure 3:
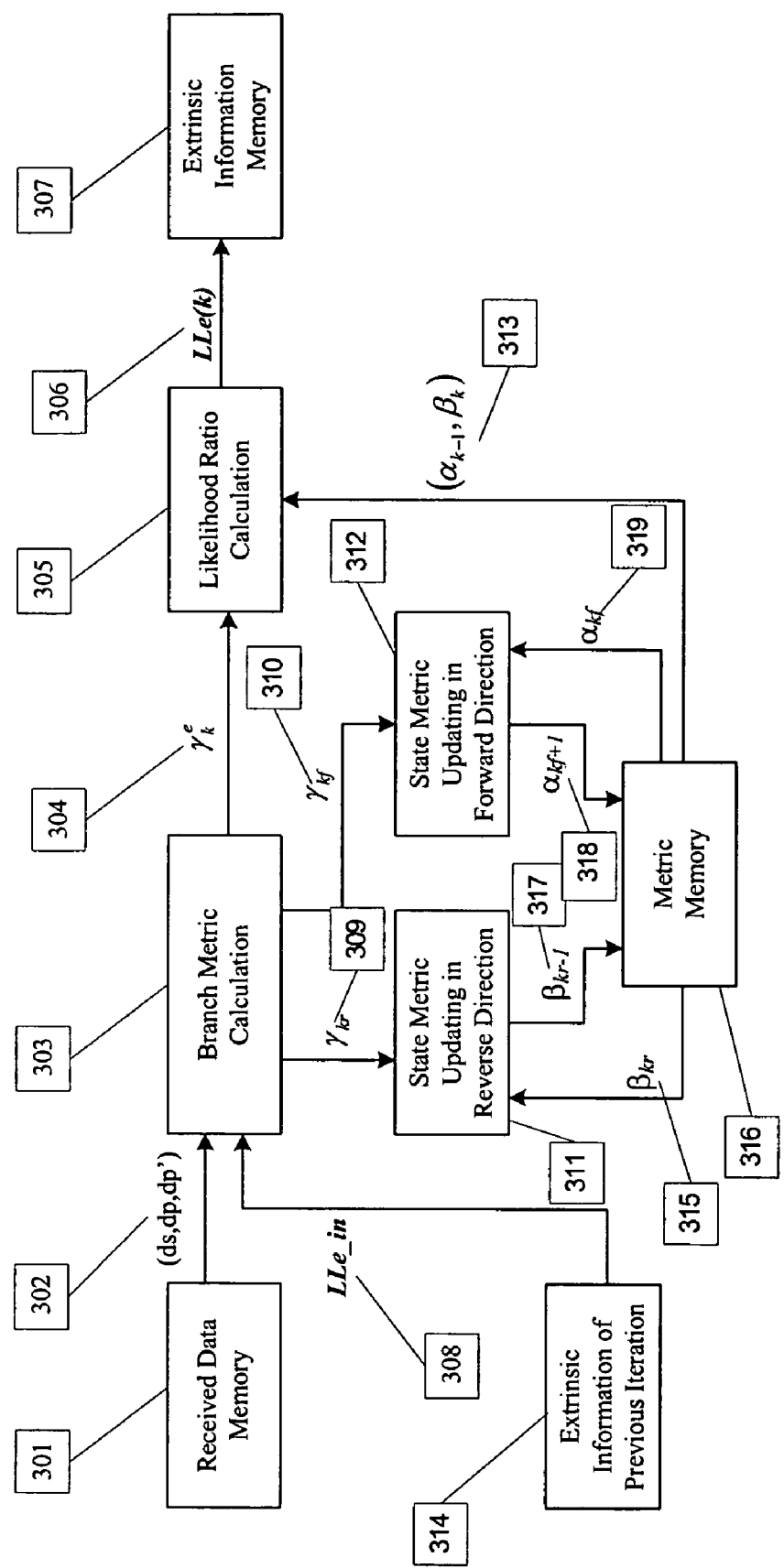
FIG. 3 is a simplified schematic block diagram of a representative, illustrative interconnection of resources detailing the operations of a MAP decoder using a known method.

FIG. 3 is a simplified schematic block diagram of representative, illustrative interconnection of resources detailing the operations of the MAP decoder using a known method. The received data 302 and the extrinsic information of the previous iteration 308 are fed into the branch metric calculation unit 303 from the received data memory 301 and the extrinsic information of the previous iteration 314, respectively, to generate the branch metric $\gamma_k^e$ 304 for the likelihood ratio calculation, $\gamma_{k,f}$310 for the state metrics updating in the forward direction and $\gamma_{k,r}$ 309 for the state metrics updating in the reverse direction. The state metrics-updating unit in the forward direction 312 uses $\gamma_{k,f}$310 from the branch metric calculation unit 303 and the state metrics in the previous step $\alpha_{k,f}$319 from the metric buffer/memory 316 to update the state metrics $\alpha_{k,f+1}$ 318 in the forward direction. The state metrics-updating unit in the reverse direction 311 uses $\gamma_{k,r}$ 309 from the branch metric calculation unit 303 and the state metrics in the previous step $\beta_{k,r}$ 315 from the metric buffer/memory 316 to update the state metrics $\beta_{k,r-1}$ 317 in the reverse direction. When the branch metrics $\gamma_k^e$ 304 and the state metrics ($\alpha_{k-1}$, $\beta_k$) 313 in both recursion directions are available at the inputs of the likelihood ratio calculation unit 305, the likelihood ratio LLe(k) 306 is generated and stored in the extrinsic information buffer/memory for the next iteration.

In order to simplify the computation, the known log-MAP algorithm, such as has been shown in Robertson et al. "A comparison of optimal and suboptimal MAP decoding algorithms operation in the log domain," *Proc. 1995 Int. Conf. on Comm.*, pp. 1009-1013 and in Viterbi, "An intuitive justification and a simplified implementation of the MAP decoder for convolutional codes," IEEE JSAC, pp. 260-264, February 1998, each of which is incorporated herein by reference, is employed in most implementations. The simplification is $$LLR_k = \frac{\sum_{s^+} \alpha_{k-1}(s') \gamma^e(s', s) \beta_k(s)}{\sum_{s^-} \alpha_{k-1}(s') \gamma^e(s', s) \beta_k(s)}; \quad (4)$$

where $$\Gamma_k(s', s) = \ln(p(s_k = s/s_{k-1} = s'))$$
$$= \frac{1}{2} x_k (LLR_k + L_c ds_k^s) + \frac{1}{2} L_c dp_k Y_k$$
$$= \frac{1}{2} x_k (LLR_k + L_c ds_k^s) + \Gamma_k^e(s', s)$$

where $$\Gamma_k^e(s', s) = \frac{1}{2} L_c dp_k Y_k.$$

Jacobian equality can be used to simplify the exponential computation in log-MAP algorithm as follows:

$$\ln(e^a + e^b) = \text{Log\_Sum}(a,b) = \max(a,b) + \ln(1 + \exp(-|b-a|)) \quad (5)$$

For implementation, $\ln(1+\exp(-|b-a|))$ can be realized with a lookup table. According to previous studies, e.g., in Robertson et al., mentioned above, a lookup table size of 8 can provide enough accuracy.

The normalization in the log-MAP algorithm is modified as $$A_k(s) = A'_k(s) - \max_{s \in S}\{A'_k(s)\} \quad (6)$$

$$B_k(s) = B'_k(s) - \max_{s \in S}\{B'_k(s)\} \quad (7)$$

where $$A'_k(s) = \text{LOG\_SUM}_{s' \in S}\{F_{k-1}(s)\}, \quad (6a)$$

$$F_{k-1}(s) = A_{k-1}(s') + \Gamma_k(s', s)$$

$$B'_{k-1}(s') = \text{LOG\_SUM}_{s \in S}\{R_k(s')\}, \quad (7a)$$

$$R_k(s') = B_k(s) + \Gamma_k(s', s)$$

In log-MAP algorithm, extrinsic information is $$LLR_k = \text{Log\_Sum}_{s \in S+}\{P_k(s)\} - \text{Log\_Sum}_{s \in S-}\{P_k(s)\} \quad (8)$$

where $$P_k(s) = A_{k-1}(s') + \Gamma^e_k(s', s) + B_k(s).$$

According to the idea of MAP and log MAP algorithms, state metrics at each step consists of a set of numbers limited within upper and lower boundaries. A state metric with the largest value means the state is the correct state on the optimal decoding path with the highest probability. If $A_k(s)$ is the maximum, s is the correct state with the highest probability at the k-th step in the forward direction. If $B_k(s)$ is the maximum, s is the correct state with the highest probability at the k-th step in the reverse direction.

In equations (3) and (8), the maximum of $\{\alpha_{k-1}(s')\}/\{A_{k-1}(s')\}$ and the maximum of $\{\beta_k(s)\}/\{B_k(s)\}$ give the main contribution to $LLe_k$ and $LLR_k$. If $ds_k=+1$ transmits at the output of the encoder and the estimate of the decoder is correct, $LLe_k/LLR_k$ is close to the upper boundary. If $ds_k=-1$ transmits at the output of the encoder and the estimate of the decoder is correct, $LLe_k/LLR_k$ is close to the lower boundary. If the value of $LLe_k/LLe_k$ is closer to the upper or lower boundary, the confidence of the estimate is higher at the k-th step. If the current maximum metric is much larger than the previous maximum metric, $LLe_k/LLe_k$ will converge at the correct estimate sooner. Thus, it is important to know which state has the relative maximum, rather than the absolute maximum.

For a MAP algorithm in Turbo decoding, including the Max log-MAP algorithm, any one of the updated state metrics from equations (1) and (2) of each recursion direction can be selected as the embedded metric, for example, $\alpha'_k(0)$ and $\beta'_{k-1}(0)$ are selected as the embedded metrics for the forward and reverse directions, respectively. The embedding procedure is as follows:

$$\alpha_k(s)=\alpha'_k(s)/\alpha'_k(0), s \in S \quad (9);$$

$$\beta_{k-1}(s)=\beta'_{k-1}(s)/\beta'_{k-1}(0), s \in S \quad (10).$$

For a log-MAP algorithm in Turbo decoding, any one of the updated state metrics from equations (6) and (7) of each recursion direction can be selected as the embedded metric, for example, $A'_k(0)$ and $B'_{k-1}(0)$ are selected as the embedded metrics for the forward and reverse directions, respectively. The embedding procedure is as follows:

$$A_k(s)=A'_k(s)-A'_k(0), s \in S \quad (11);$$

$$B_{k-1}(s)=B'_{k-1}(s)-B'_{k-1}(0), s \in S \quad (2).$$

After the embedding procedure of MAP and log-MAP, the original relationship among the updated state metrics is maintained in the new set of state metrics due to the linear operations of division and subtraction. The embedded metric is always equal to a constant, i.e., one for a MAP decoder and zero for log a MAP decoder. Thus, $\{\alpha(0)\}=\{\alpha_0(0), \alpha_1(0), \ldots, \alpha_{length}(0)\}/\{A(0)\}=\{A_0(0), A_1(0), \ldots, A_{length}(0)\}$ and $\{\beta(0)\}=\{\beta_0(0), \beta_1(0), \ldots, \beta_{length}(0)\}/\{B(0)\}=\{B_0(0), B_1(0), \ldots, B_{length}(0)\}$ are not required to be stored in the state metrics memory. This technique is called embedded state metric storage (EMSM). It can reduce the memory requirement by a factor of 1/M.

Since $\alpha_k(0)/A_k(0)$ and $\beta_k(0)/B_k(0)$ are always constant, one for a MAP decoder and zero for a log-MAP decoder after the embedding procedure, the calculation using the embedded metric as an input signal can be omitted during state metrics updating and extrinsic information calculation. Thus, EMSM will not increase the computational load. The contribution of the embedded metrics during the state metrics updating and extrinsic information calculation is provided by the embedded relationship among the other state metrics, and EMSM can achieve the same result with known methods.

Figure 4:
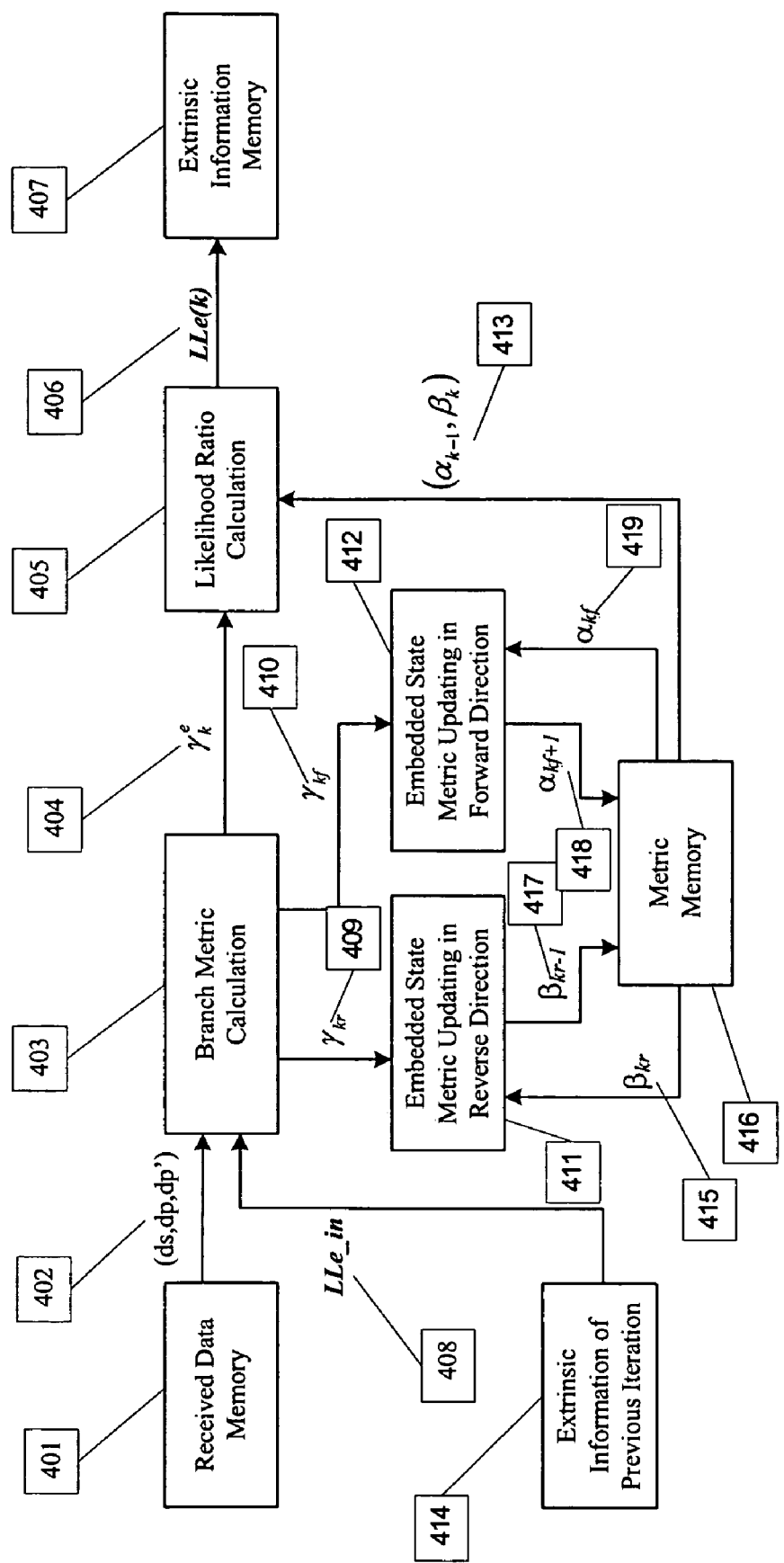
FIG. 4 is a simplified schematic block diagram of a representative, illustrative interconnection of resources detailing the operations of MAP decoder in accordance with the present invention.

FIG. 4 is a simplified schematic block diagram of representative, illustrative interconnection of resources detailing the operations of MAP decoder and log-MAP decoder using the present invention. The received data (ds,dp,dp') 402 and the extrinsic information of the previous iteration LLe_in 408 are fed into the branch metric calculation unit 403 from the received data memory 401 and the memory of the extrinsic information of the previous iteration 414, respectively, to generate the branch metric $\gamma_k^e$ 404 which is applied to the likelihood ratio calculation unit 405, which produces at its output $LLe_k$ 406 likelihood ratio calculation. The branch metric calculation unit 403 also produces the branch $\gamma_{kf}$ 410 for the state metrics updating in the forward direction and the branch metric $\gamma_{kr}$ 409 for the state metrics updating in the reverse direction.

The embedded state metrics-updating unit in the forward direction 412, in which multiplication for MAP algorithm or addition for log-MAP algorithm with the embedded metric are omitted, uses the branch metric $\gamma_{kf}$ 410 from the branch metric calculation unit 403 and the state metric in the previous step $\alpha_{kf}$ 419 from the metric buffer/memory 416 to update the state metric $\alpha_{kf+1}$ 418 in the forward direction. The embedded state metrics-updating unit in the reverse direction 411, in which multiplication for MAP algorithm or addition for log-MAP algorithm with the embedded metric is omitted, uses the branch metric $\gamma_{kr}$ 409 from the branch metric calculation unit 403 and the state metric in the previous step $\beta_{kr}$ 415 from the metric buffer/memory 416 to update the state metric $\beta_{kr-1}$ 417 in the reverse direction. The embedded metric is not stored in the state metric buffer/memory 416.

Updating of state metrics is preferably done in accordance with the known sliding window (SW) technique in practical systems to reduce the memory requirement. As mentioned in the background section, all of the metric information of the forward and reverse directions must be temporarily stored to calculate the extrinsic information. If the data frame length is large, the temporary memory will be huge. In practical systems, only part of the frame, called a window, instead of the whole frame is used to compute the extrinsic information, ignoring some of the extrinsic information, thus causing performance degradation. However, with a window sliding from the head to the end of the frame, all of the extrinsic information is obtained. The sliding window works as follows:
a) The window starts at the end of the data frame, let step number k=0, source symbol frame length=L, window size=W and training size=T;
b) Perform forward metric update from the $k^{th}$ source symbol information, save the forward metric from k to k+W−1; if ((k+W+T)>L, then perform forward metric update from $k^{th}$ source symbol information, save the forward metric from k to L−1;
c) Perform reverse metric update from the $(k+W+T)^{th}$ source symbol information, save the forward metric from k+W to k+1; if ((k+W+T)>L, then perform reverse metric update from the $(L)^{th}$ source symbol information, save the forward metric from L to k+1;
d) Calculate extrinsic information from k to the (k+w−1) for source symbols; if (k+W+T)>L, then calculate extrinsic information from k to the (L−1) for source symbols;
e) Update k=k+W; if k<L then go to step b; otherwise this iteration terminates.

Thus the temporary memory depth reduces from 2 frame lengths to 2 window sizes. In generally, the training size should at least be 3 or 4 times of the state size. EMSM can help the SW technique to reduce metric memory requirement in the same way as mentioned in the previous paragraph.

When the branch metric $\gamma_k^e$ 404 and the state metrics $(\alpha_{k-1}, \beta_k)$ 413 in both recursion directions are available at the input of the likelihood ratio calculation unit 405, the embedded likelihood ratio $LLe_k$ 406, in which multiplication for the MAP algorithm or addition for the log-MAP algorithm with the embedded metric is omitted, is generated and stored in the extrinsic information buffer/memory for the next iteration.

Figure 5:
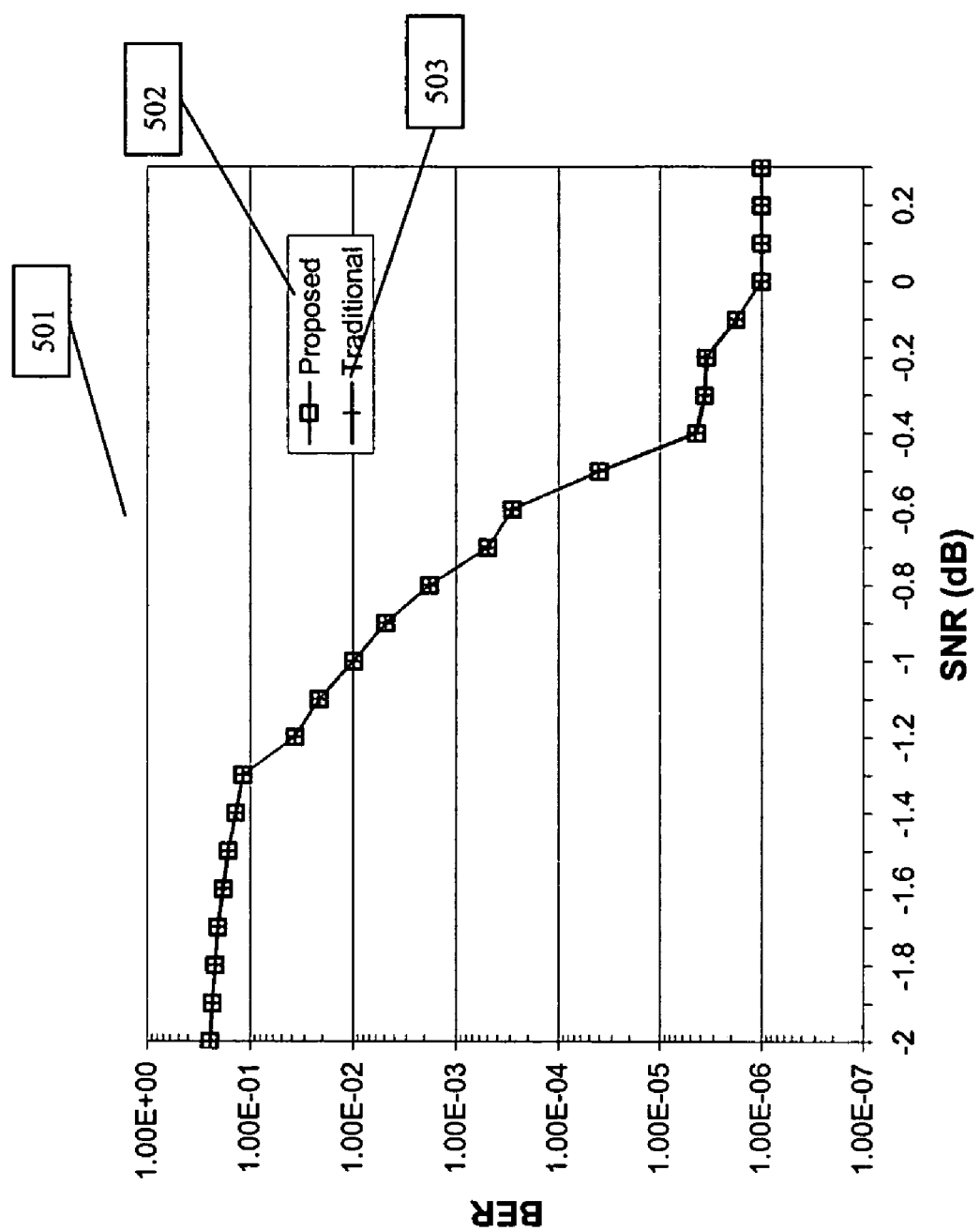
FIG. 5 is a diagram of the performance (i.e., Bit Error Rate (BER)) comparison of the MAP decoder with the present invention and with the known method on AWGN channel. The Turbo code used in the simulation is based on the cdma2000 standard with a Length=1146 and a code rate=⅓.

FIG. 5 shows the performance comparison curves 501 comparing the log-MAP decoder in accordance with the present invention and the known method on an AWGN channel. The turbo code used in this performance analysis is based on the cdma2000 standard with Length=1146 and code rate=⅓. The log-MAP decoder with EMSM 502 can achieve the same performance with the known method 503, and EMSM can reduce the memory used by 12.5% compared to the known method. In FIG. 5 we find that there is almost no difference between the two curves, indicating that EMSM can achieve the same decoding performance as the traditional decoding scheme.

Figure 6:
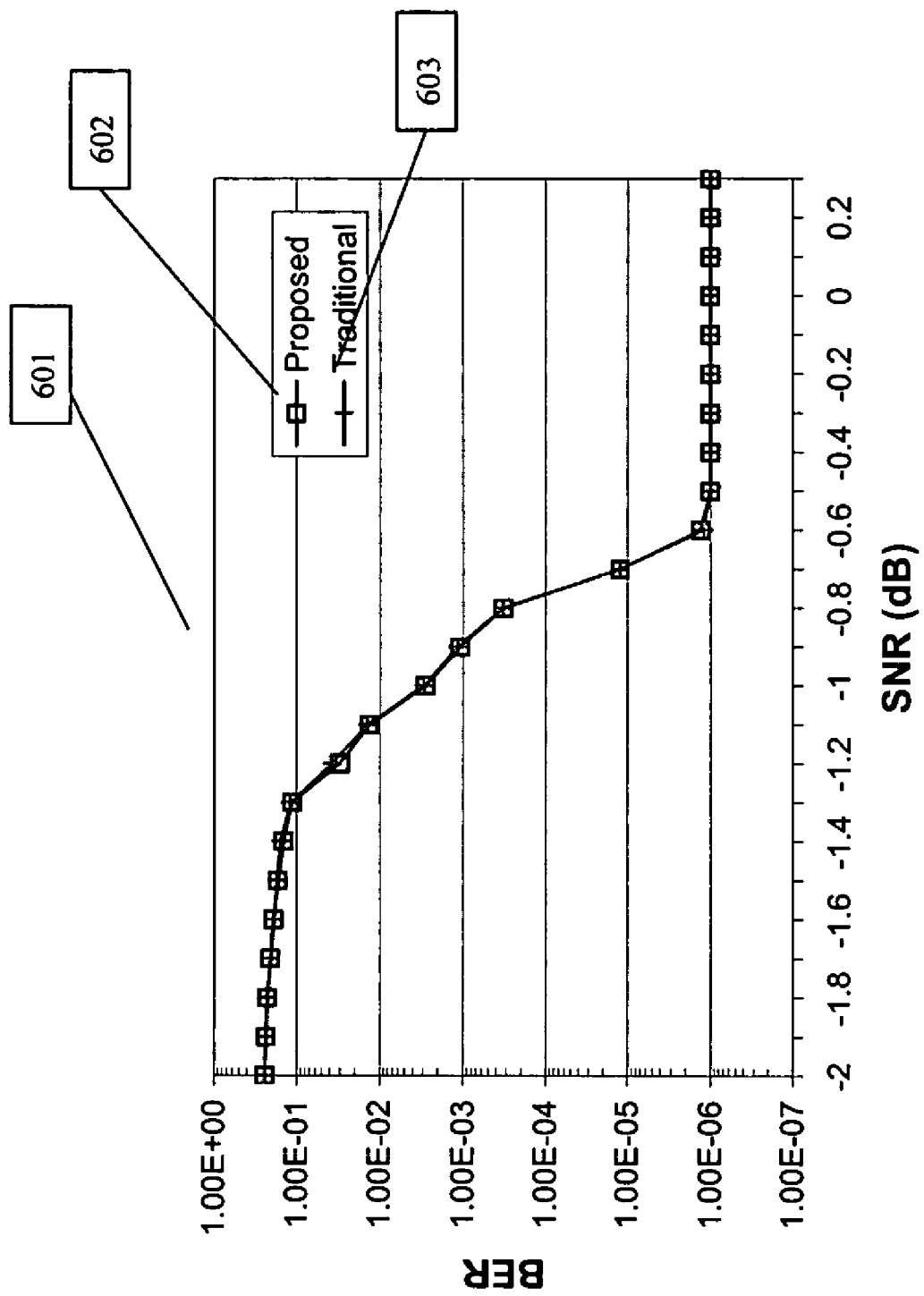
FIG. 6 is a diagram of the performance comparison of the MAP decoder with the present invention and with the known method on AWGN channel. The Turbo code used in the simulation is based on the cdma2000 standard with a Length=3066 and a code rate=⅓.

FIG. 6 shows the performance comparison curves 601 comparing the log-MAP decoder in accordance with the present invention and the known method on an AWGN channel. The turbo code used in this performance analysis is based on the cdma2000 standard with Length=3066 and code rate=⅓. The log-MAP decoder with EMSM 602 can achieve the same performance with the known method 603, and EMSM can reduce the memory used by 12.5% compared to the known method. Again, we find that there is almost no difference between the two curves, indicating that EMSM can achieve the same decoding performance as the traditional decoding scheme.

By virtue of the above techniques, a MAP decoder can be produced that has performance nearly identical to the conventional MAP decoder, yet which requires much less memory. The architecture shown in FIG. 4 can be used to construct the MAP decoder, which is implemented in an FPGA, PLC or ASIC with EMSM technique.

The present invention has been described above in connection with certain illustrative embodiments. However, the present invention is in no way limited to the disclosed embodiment, which are exemplary and not intended to limit the scope of the invention, which is to be interpreted in accordance with the appended claims.

What is claimed is:

1. A method of state metrics storage in a turbo decoder applicable to various decoding algorithms, comprising:
   (a) updating the state metrics using a sliding window method;
   (b) selecting an embedded metric from the updated ones of the state metrics in forward or reverse recursion directions;
   (c) performing a different calculation on said updated state metrics and said embedded metric for respective different ones of said decoding algorithms; when the forward and reverse state metrics are available, performing extrinsic information calculation;
   (d) saving said embedded metric in a state metric buffer;
   (e) saving a result of said calculation at step (c) for use as an input signal during state metrics updating and extrinsic information calculation.

2. The method according to claim 1, wherein a state metric is selected as said embedded metric.

3. The method as in claim 1, wherein when the algorithm is the MAP algorithm, said calculation involves dividing said updated state metrics by one.

4. The method as in claim 1, wherein when the algorithm is the log-MAP algorithm, said calculation involves subtracting said updated state metrics from zero.

5. The method as in claim 1, wherein when the algorithm is the Max log-MAP algorithm, said calculation involves subtracting he said updated state metrics from zero.

6. An apparatus for implementing state metrics storage in a turbo decoder applicable to various decoding algorithms, comprising:
   means for updating the state metrics using a sliding window method;
   means for selecting an embedded metric from updated state metrics in forward or reverse recursion directions;
   means for performing a different calculation on said updated state metrics and said embedded metric for respective different ones of said decoding algorithms;
   means for performing a different calculation on said updated extrinsic information with metrics metric for respective different ones of said decoding algorithms;
   means for saving said embedded metric in a state metric buffer;
   means for saving a result of said calculation for use as an input signal during state metrics updating and extrinsic information calculation.

7. The apparatus according to claim 6, wherein the apparatus is realized with a programmable logic device (PLD).

8. The apparatus according to claim 6, wherein the apparatus is realized with a field-programmable gate array (FPGA).

9. The apparatus according to claim 6, wherein the apparatus is realized with application-specific integrated circuit (ASICs).

10. The apparatus according to claim 6, wherein when the algorithm is the MAP algorithm, said calculation involves dividing said updated state metrics by one.

11. The apparatus according to claim 6, wherein when the algorithm is the log-Map algorithm, said calculation involves subtracting said updated state metrics from zero.

12. The apparatus according to claim 6, wherein when the algorithm is the Max log-MAP algorithm, said calculation involves subtracting said updated state metrics from zero.

* * * * *